United States Patent [19]
Friedman et al.

[11] Patent Number: 4,559,096

[45] Date of Patent: Dec. 17, 1985

[54] PRECISELY MODIFYING PREDETERMINED SURFACE LAYERS OF A WORKPIECE BY CLUSTER ION IMPACT THEREWITH

[75] Inventors: Lewis Friedman; Robert J. Buehler, both of Patchogue; Michael W. Matthew, East Patchogue; Myron Ledbetter, Belle Terre, all of N.Y.

[73] Assignee: The United States of America as represented by the United States Department of Energy, Washington, D.C.

[21] Appl. No.: 623,874

[22] Filed: Jun. 25, 1984

[51] Int. Cl.$^4$ .................. B23K 9/00; B32B 31/00; B05D 3/06

[52] U.S. Cl. .................. 156/272.2; 156/253; 204/192 C; 204/192 E; 219/121 R; 427/38; 427/85

[58] Field of Search ............... 156/643, 644, 252, 253, 156/272.2, 279, 280; 219/121 R, 121 EE, 121 EH, 121 EJ, 121 EK, 121 PD, 121 PE, 121 LH, 121 LJ, 122; 204/192 C, 192 EC, 192 E; 148/187; 134/1; 427/85, 38, 39; 250/492.3, 493.1

[56] References Cited

PUBLICATIONS

Beuhler et al., "Threshold Studies of Secondary Electron Emission Induced by Macro-Ion Impact on Solid Surfaces", *Nuclear Instruments and Methods*, 1980, pp. 309-315.

Dietzel et al., "Micrometeoroid Simulation Studies on Metal Targets", *Journal of Geophysical Research*, Mar. 10, 1972, pp. 1375-1395.

Fischer et al., "Production and Use of Nuclear Tracks: Imprinting Structure on Solids", *Reviews of Modern Physics*, vol. 56, No. 4, Oct., 1983, pp. 907-948.

Cable, "Hypervelocity Accelerators", Chapter 1, *High-Velocity Impact Phenomenon by Kinslow*, 1970, pp. 1 and 3-21.

Takagi et al., "Film Formation by Ionised-Cluster Beam Deposition", *Low-Energy Ion Beams*, 1977, pp. 142-150.

*Primary Examiner*—William A. Powell
*Attorney, Agent, or Firm*—Vale P. Myles; James W. Weinberger; Judson R. Hightower

[57] ABSTRACT

A method of precisely modifying a selected area of a workpiece by producing a beam of charged cluster ions that is narrowly mass selected to a predetermined mean size of cluster ions within a range of 25 to $10^6$ atoms per cluster ion, and accelerated in a beam to a critical velocity. The accelerated beam is used to impact a selected area of an outer surface of the workpiece at a preselected rate of impacts of cluster ions/cm$^2$/sec. in order to effect a precise modification in that selected area of the workpiece.

33 Claims, 13 Drawing Figures

PRECISELY MODIFYING PREDETERMINED SURFACE LAYERS OF A WORKPIECE BY CLUSTER ION IMPACT THEREWITH

The U. S. Government has rights in this invention pursuant to Contract Number DE-AC02-76CH00016, between the U.S. Department of Energy and Associated Universities Inc.

BACKGROUND OF THE INVENTION

The invention relates to a method for effecting precise modifications in predetermined surface layers of a workpiece by impacting those layers with cluster ions that are accelerated to a critical velocity and that are directed to impact a selected area of the workpiece at a preselected rate of impacts of cluster ions per square cm., or per unit area, per second. More particularly, the invention relates to a method for precisely modifying predetermined surface layers of a workpiece by either removing selected areas of such layers, or by compressing selected areas of such layers, or by enlarging the grain size of the crystalline structure of such layers, or by eroding or vaporizing preselected areas of an outer surface layer of a workpiece. In addition, the invention relates to a method of precisely modifying a workpiece of sheet or film material by making holes of predetermined, very small diameters through the workpiece. Such holes are made by simply impacting the workpiece with cluster ions, and without requiring the use of chemicals or other etching means to achieve the formation of the desired hole diameters.

A variety of methods and processes are known for effecting controlled very small modifications in many different kinds of workpieces. In general, such known processes and methods can be divided into two categories; namely, those that effect such modifications by chemical treatment of a workpiece, and those that effect physical modifications such as, for example micro-machining a workpiece with a tool, or with the application of a medium for effecting physical erosion of selected areas of the workpiece, or by vacuum deposition of material onto a surface of a workpiece.

Utility for the known methods and processes of effecting small modifications in workpieces has been found in; machining work surfaces, implanting layers of material onto a workpiece surface, changing the crystalline grain structure of a surface by chemically growing large crystals on the surface, making very fine filters by chemically etching bores that have been created in a workpiece by bombarding it with charged particles, as well as in numerous other applications of such methods. In many applications of known methods and processes, such as those used to manufacture micro-electronic devices, existing practical working limits are now restricting the attainment of any significantly higher packing densities for such devices. In order for the next generation of micro-electronic devices to supplant current state of the art silicon, gallium arsenide and similar inorganic p/n junction devices, extensive efforts are now being directed to develop methods for achieving greater packing densities in such devices by employing so-called monolayer assemblies of atoms or molecules in making the devices. As used in such a contest, and hereinafter, the so-called monolayer assemblies actually comprise systems that are a few, i.e., one to ten layers in thickness.

When chemical processes are developed to manufacture such so-called monolayer assemblies, the efforts tend to be directed at making mono-molecular layers of organic semiconducting polymers, which are called synthetic molecular organizates. When development efforts are directed at changing the physical orientations of such devices, there is a tendency to use more conventional semiconductor materials, such as gallium arsenide assembled in densely packed arrays of p/n junctions, which arrays make up so called super-lattices. The growing interest in using such atomic and molecular assemblies for manufacturing electronic devices is reflected in a recent issue of *Scientific American,* 249 (5), page 144 (November 1983), by G. H. Dohler, in which he describes an inorganic semiconductor method for making such devices. The solid state super-lattice devices thus described comprise crystals grown by depositing semiconductors in layers the thickness of which are measured in atoms. In an article in *Chemical and Engineering News,* p. 27 (May, 1983), by J. L. Fox, he describes the current interest exhibited by chemists in the possibilities of making molecular scale devices that rely on organic polymers and charge transfer complexes. More recently it has been proposed to use mono-molecular film cation/anion membranes in advanced electronic and electrochemical information processing and energy control applications, such as in micro-electronic circuit chips, and fuel cells.

Two common characteristics of all such research and development efforts is their aim to develop or discover methods that can (1) afford more precision control of modifications effected in a workpiece, and (2) achieve smaller and smaller precise modifications in a workpiece. Thus, improved future methods should afford the desired denser packing capabilities for microelectronic devices, as well as enabling both more predictable and finer control of micro-machining operations on workpieces, and in the manufacture of filters having finer filtering capabilities than heretofore known.

Because the present invention relates to a method that uses accelerated cluster ions to precisely modify a workpiece, rather than being a method that employs chemical reactions, per se, to achieve such a modification, the closest known prior art methods discussed below, as being of comparable interest, do not list chemical methods. Thus, methods are known in the prior art, whereby; (1) single atoms or molecules are accelerated to either implant them deeply into a workpiece, or to bombard a workpiece and achieve secondary emission of particles from it, (2) large cluster ions are used to bombard a workpiece and effect sputtering of large masses of material from it, and (3) low velocity cluster ions randomly mixed with neutral clusters, are used to clean surfaces and to deposit films on an outer surface of a workpiece. One example of the type of uses explored with the first of such prior art methods is described in an articled entitled, "Production and Use of Nuclear Tracks: Imprinting Structure on Solids", by B. E. Fischer, et al., in Review of Modern Physics, Vol. 56, No. 4, October 1983 (pp. 907–948). That article explains how nuclear or atomic tracks create damaged zones in a workpiece along the paths made by rapidly moving accelerated ions that impact a workpiece. It points out that, most frequently such random track arrays are now employed to induce global property changes of the solid volume or surface of a workpiece.

A representative publication explaining known uses of very large cluster ions, is an article entitled, "Micrometeorite Simulation Studies on Metal Targets", by H. Dietzel, et al., which appeared in *Journal of Geophysical Research*, Mar. 10, 1972, pp. 1375-1394. That paper reports on experiments using microparticles accelerated at from 0.2 to 40 kilometers per second and having a mass ranging in size from greater than $3 \times 10^{-10}$ grams and less than $3 \times 10^{-13}$ grams. Such particles were used to bombard thin plates of aluminum, copper, cadmium, tin and several other metals to form craters in a polished surface thereof.

A representative publication explaining known uses of low velocity cluster ions, that are randomly mixed with neutral clusters, is an article entitled, "Film Formation by Ionized-Cluster Beam Deposition", by T. Takagi, et al., which appeared in Conference Series No. 38, *Low-energy Ion Beams*, 1977, (Sept. 5-8, 1977), published by The Institute of Physics, Bristol and London, UK.

In all such types of known prior art methods, i.e. those for accelerating either single atoms or molecules, those for accelerating so called micrometeoroid cluster ions, and those for accelerating low velocity cluster ions, it is obviously necessary to employ a suitable accelerator. Many types of such accelerators are known and a discussion of several different hypervelocity accelerators is given in a book entitled, "*High Velocity Impact Phenomena*", by R. Kinslow, published in 1970 by Academic Press. Chapter 1 entitled, "Hypervelocity Accelerators", explains that such accelerators basically can be categorized as either gun accelerators or explosive accelerators. The method of the present invention, in its disclosed preferred embodiments as discussed herein, utilizes a gun type accelerator for accelerating cluster ions, as is more fully explained below. A further example of a type of accelerator apparatus that is useful in accelerating cluster ions is described in an article by two of the inventors named in the present application, i.e. by R. J. Beuhler and L. Friedman. The article is entitled, "Threshhold Studies of Secondary Electron Emission Induced by Macro-ion Impact on Solid Surfaces". It was published during 1980 in *Nuclear Instruments and Methods*. pp. 309-315. That article explains how water cluster ions in the m/e range $3.7 \times 10^2$ to $6.0 \times 10^4$ were formed in an ion source consisting of a 0.625 mm diameter copper wire placed approximately 1.2 centimeters away from a first expansion aperture of about 0.15 mm diameter, of a supersonic molecular beam source. A positive 6 kv potential was applied to the wire, while a mixture of water vapor and nitrogen was passed concentrically around it toward the above-noted first expansion aperture. It was reported that the mass of the resultant water cluster ions could be conveniently varied over an extended range of sizes by selectively varying the flow rate and/or temperature of the nitrogen mixing gas. Subsequently, cluster ion acceleration was accomplished in a 34-stage, 93 centimeter long, acceleration column. The electric field in the acceleration column was approximately 10 kilovolts/cm.

Another detailed description of a suitable apparatus for the production and acceleration of cluster ions is presented in copending U.S. patent application No. 452,362, by Messrs. L. Friedman and R. J. Beuhler, which application was filed Dec. 22, 1982.

All of the types of known prior art methods for utilizing accelerated particles, i.e., those using atoms or molecules, or those using dust-particle-size micrometeoroid ions, or those using low velocity cluster ions randomly mixed with neutral ion clusters, have not been found capable of precisely modifying a predetermined surface layer of a workpiece, or of forming precision-diameter holes through a workpiece, or of performing in the optimum manner of the present invention the other advantageous precision functions that can be achieved with its practice. A particular disadvantage of those prior art methods, relative to the method of the present invention, is that they inherently produce a more random distribution of energy in a workpiece than is characteristic of the carefully controlled diffusion of energy in a precise area of a workpiece, by appropriate application of the method disclosed herein. A major advantage of the novel method of the present invention is that it provides a means for concentrating precisely predetermined amounts of energy in a narrow preselected area and depth of a workpiece, thereby to effect a desirably precise, small modification in that area. In that sense, the advantage and utility of the method of the present invention, relative to known prior art methods, is somewhat analogous to the dramatic advantages realized from the coherent energy and the precisely controlled, focused power of a laser beam, compared to the dispersed energy achievable from a normal light beam.

OBJECTS OF THE INVENTION

Accordingly, it is a primary object of the invention to provide a method for precisely modifying predetermined surface layers of a workpiece in a more carefully controllable and efficient manner than has heretofore been possible.

Another object of the invention is to provide a method of precisely modifying a workpiece by making holes of a predetermined diameter through it, without requiring any chemical etching of the holes.

A further object of the invention is to provide a method for forming cluster ions ranging in size from 25 to $10^6$ atoms and accelerating them to a critical velocity to impact a selected area of a workpiece, at a preselected controlled rate of impacts, in order to precisely modify only predetermined outer surface layers of the workpiece.

Yet another object of the invention is to provide a method for forming ultra-small apertures through, or cavities in, a workpiece, without requiring any chemical etching of the holes or cavities, or of the workpiece surfaces.

A still further object of the invention is to provide a method for modifying a predetermined outer surface layer of a workpiece, to achieve a desired modification in the grain size of its structure, by impacting a selected area of said outer layer with cluster ions in a narrow predetermined mass selection range, with the cluster ions being accelerated at a critical velocity, and focused into a narrow beam that produces a preselected rate of cluster ion impacts on the selected area of the workpiece.

Still another object of the invention is to provide a method of precisely modifying a selected area of an outer surface layer of a workpiece by compressing it with the force of impacts of cluster ions on it, while avoiding a similar modification of deeper layers of material in the workpiece.

Yet a further object of the invention is to provide a method of precisely modifying a workpiece by bonding cluster ions to it in a densely packed arrangement.

Additional objects and advantages of the invention will be apparent to those skilled in the art, from the description of it presented herein, considered in conjunction with the accompanying drawings.

SUMMARY OF THE INVENTION

In a preferred arrangement of the method of the invention for precisely modifying predetermined portions of a workpiece, a beam of charged cluster ions is produced with a predetermined percentage of the cluster ions being in a narrow mass selected range. The beam of cluster ions is then accelerated by passing it through an electric field of predetermined strength in order to impart a critical velocity of at least $10^6$ centimeters per second to the cluster ions. Finally, the cluster ions are impacted against a selected area of the workpiece at a preselected rate of impacts of cluster ions per square unit per second, in order to effect a desired precise modification in the workpiece. In various applications of the method of the invention, the resultant precise modification of the workpiece comprises, respectively; micromachining of a predetermined number of outer surface layers of the workpiece, effecting a predetermined compression of certain outer surface layers of the workpiece without similarly compressing deeper layers, changing the granular structure of predetermined layers of a workpiece, or forming either holes or cavities, of a precisely predetermined small diameter, through or in a workpiece, as well as other applications which are more fully disclosed herein.

BRIEF DESCRIPTION OF THE PREFERRED EMBODIMENTS

Figure 1:
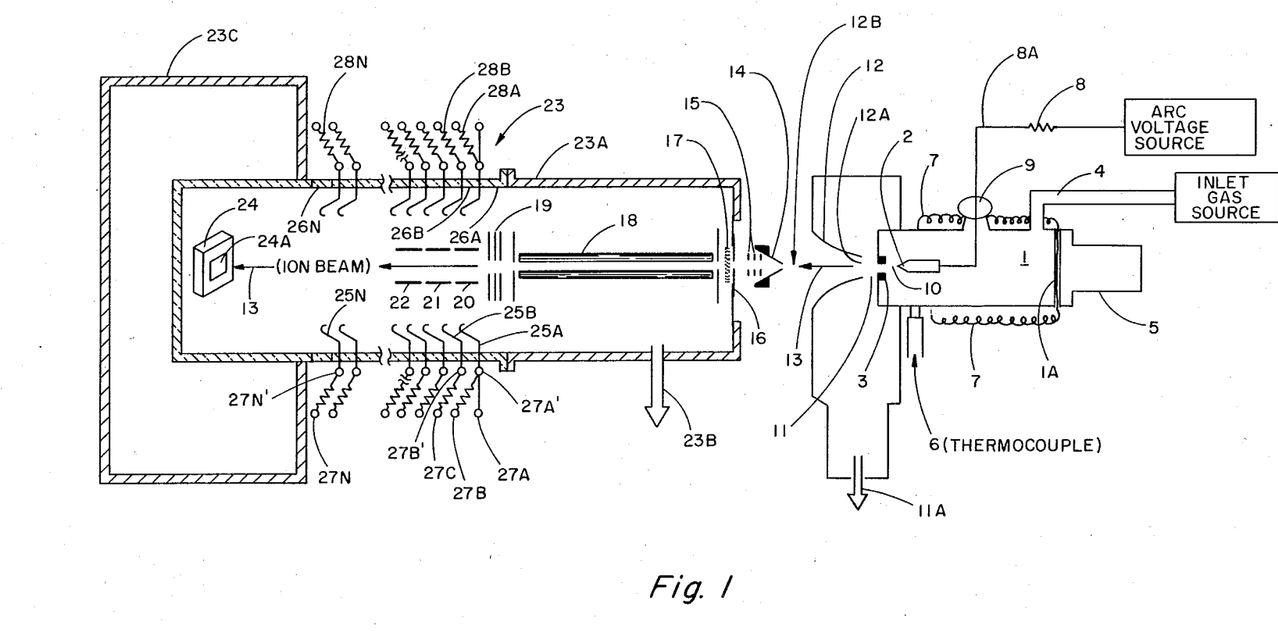
FIG. 1 is a side plan view of a schematic diagram of an apparatus that is useful for producing and accelerating cluster ions of a predetermined size, illustrated in association with a workpiece that is to have a predetermined portion of its surface precisely modified by the method of the invention. Accordingly, the workpiece is arranged to be impacted with a narrow mass selection of cluster ions that are accelerated by the apparatus to a critical velocity, and focused to apply a preselected rate of impacts to a selected surface area of the workpiece.

Before describing the preferred method of the invention, and various applications of it, reference is first made to FIG. 1 in order to briefly describe a suitable apparatus for producing cluster ions and for accelerating them in a suitably focused beam, so that they can be used according to the method of the invention. The depicted apparatus includes a cluster ion source chamber 1, that may be formed of stainless steel or other conventional housing 1A. Source chamber 1 is provided with a suitable means for creating a plasma or discharge from the tip of an arc electrode 2. In the illustrated apparatus, the venting means comprises a radially tapered super sonic expansion nozzle 3. The minimum diameter of nozzle 3 is closest to the electrode 2, with the maximum diameter of the nozzle at its outer end relative to the electrode 2. The ion source chamber is supplied with a desired gas or mixture of gases through a conventional gas inlet conduit 4 from a suitable source (indicated diagrammatically). All such gases can exit from chamber 1 only through the nozzle 3. The plasma or discharge from arc electrode 2 creates seed ions that then grow into larger cluster ions, due to collisions of the ions with neutral gas, as the plasma and the gas from inlet conduit 4 mix and travel toward the nozzle 3, and as the mixture expands through nozzle 3 and enters into the downstream vacuum system.

Different compositions and sizes of cluster ions can be formed in such an apparatus by varying the gas composition entering chamber 1 through conduit 4 and by changing the temperature within the source chamber 1. For example, if the ion source chamber 1 is operated at room temperature, and a mixture of approximately 2% water vapor in a carrier gas consisting essentially of helium is used, cluster ions of water are formed by the apparatus. In such an application, the carrier gas, helium, is sufficiently inert to prevent it from being incorporated into the cluster ions that are formed in the chamber 1. The helium is used to stabilize the plasma arc discharged from electrode 2, and to help cool the cluster ions as they are being formed by collisions of the seed ions with the condensible water vapor. The mass of resultant water cluster ions can be varied, as desired, by changing the temperature of source chamber 1, the dimensions of nozzle 3, the arc wattage, or the concentration of water vapor in the carrier gas entering via conduit 4.

Cluster ion beams of nitrogen or argon can also be formed in the ion source chamber 1 by cooling the chamber 1 with a suitable attached conventional refrigeration unit 5. In such an alternative application, liquid nitrogen can be used in the refrigeration unit 5 to cool the chamber 1 to a temperature of about 77° Kelvin. A mixture of either nitrogen or argon is then used in the helium carrier gas entering via conduit 4, rather than mixing water vapor with the He.

The temperature of ion source chamber 1 can be measured with a conventional thermocouple 6 that is mounted, by any well known means, in good thermal contact with the source chamber. Beams of hydrogen cluster ions have been made in such an apparatus by cooling the source chamber 1 to temperatures around 20° K, while supplying pure hydrogen (without any other carrier gas), at pressures on the order of 0.05 atmospheres, through the inlet conduit 4.

Alternatively, beams of metallic cluster ions can be produced, with the apparatus illustrated, by introducing a suitable source metal directly into the source chamber 1. Preferably, such a metal is a solid form. The source chamber 1 is then heated with a heater, such as the conventional electrical heater coil 7 shown disposed around the chamber 1. Such heating must be effective to increase the temperature within chamber 1 to a high enough level to produce a vapor pressure of the source metal in the carrier gas supplied through conduit 4, that is sufficient to effect the formation of cluster ions in the plasma, which is expanded from the source chamber 1 through nozzle 3.

In all such applications of the illustrated apparatus, a sufficient input voltage is applied to arc electrode 2, from a suitable source of arc voltage (shown diagramatically) through a series current limiting resistor 8 and associated circuitry such as conductor 8A. The source input voltage applied to the resistor 8, which typically is about $6 \times 10^6$ ohms, is normally 500 volts to 15 kv, thus the current in the plasma arc discharge from electrode 2 can be determined, readily, by measuring the voltage drop across this resistor. Typically, arc currents in such a cluster ion producing apparatus are small, on the order of several milliamps.

An insulating vacuum pressure feedthrough seal 9 mounts the conductor 8A for bringing the arc voltage into the source chamber 1. The position of this insulating seal 9, with respect to the plasma discharge from electrode 2, is quite critical to proper operation of the source chamber, especially during operation of the source chamber at low temperatures, such as those mentioned above with regard to the application of the apparatus to produce hydrogen or argon cluster ions. This insulation seal 9 must be located behind, or upstream from the plasma discharged from electrode 2, in order to minimize any chemical reactions between the plasma produced in the arc discharge and the material of the insulating seal 9. Such reactions can produce undesired impurities (such as $H_2O$ or $NH_3$ from the oxygen and nitrogen contained in the insulation seal). Such impurities can seriously hinder the desired operation of the ion source chamber 1. For example, an insulating layer of $H_2O$ and $NH_3$ could condense on the nozzle 3 at low temperatures, thereby completely stopping the production of a desired cluster ion beam, by not allowing any ions to be transported from the source chamber 1.

The nozzle 3 is typically formed of a suitable electrically conductive material that is able to withstand both high and low temperatures, as well as being able to withstand the harsh chemical environment of the arc discharge. Gold has been found to be one of the best materials for making such a nozzle. The axial length of the nozzle 3 can be very short. In the illustrated apparatus, the nozzle piece is made of a 0.002" thick gold foil that has a nozzle hole drilled through it. Typical dimensions of such drilled holes are from 0.003 to 0.015 inch in diameter. Longer nozzles, with axial lengths of about one-sixteenth inch can be made by drilling holes through suitably thick, i.e. about one-sixteenth inch, gold "buttons", which can then be either soldered into operating position on a wall of the ion source chamber 1, or held in operating position with conventional retaining rings. Normally, such nozzles are formed to diverge radially away from their longitudinal axes by conventional electroforming techniques.

The arc electrode 2 may be maintained at a variety of different suitable potentials, as will be more fully explained below, so long as the selected potentials are made effective to partially ionize gas in the region 10 immediately upstream from the nozzle 3. During operation of the apparatus, such partially ionized gas expands through the nozzle 3 into the region 11, just after the nozzle and before a suitable skimmer 12 having an aperture 12A. Preferably, the region 11 is pumped (as indicated diagramatically by arrow 11A) to maintain its pressure at approximately $10^{-3}$ atmosphere. Any suitable conventional pump means (not shown) can be used to effect such a pressure reduction in the region 11.

In the operation of the apparatus according to the method of the invention, most of the cluster ions formed in the chamber 1 are grown by collisions of the primary ionized metal, liquid or gas atoms or molecules and the cluster ions in the region 10, and during the expansion of the plasma, gas mixture into region 11. Some additional cluster ion growth can occur in the region 11, as the result of a lower incidence of collisions between the ionized primary gas and the ions in that region. The cluster ions, and other particles that have velocities substantially parallel to the longitudinal axis of the skimmer aperture 12A will pass through it into the region 12B, downstream from the skimmer aperture 12A. Subsequently, the resultant beam of cluster ions 13 passes through a draw-out electrode 14, focusing electrodes 15 and 16, a grid 17 which monitors ion current, and thence into a quadrupole mass analyzer 18. The mass analyzer 18 operates as a filter that utilizes well known principles of applying both radio frequency and direct current voltages to a conventional quadrupole rod assembly to allow the transmission of only one selected range of ion masses, which has a narrow (but variable) range of mass to charge ratios.

In the operation of the mass analyzer 18, it should be understood that higher molecular weight cluster ions can be transmitted through it when a relatively low frequency radio frequency power supply is used to energize its quadrupole. For example, in one application of the type of apparatus shown in FIG. 1, to practice the subject invention, a 292 KHz power supply was used with a ⅜ inch diameter quadrupole in the mass analyzer 18 in order to mass analyze cluster ions up to m/e 80,000. This 292 KHz rf power supply operates at a frequency which is a factor of 10 less than those of conventional commercially available power supplies, and it extends the m/e range of mass analyzer 18 by a factor of 100, because the transmitted ion m/e range is proportional to the inverse of the square of the applied rf frequency and the inverse square of the radius of the quadrupole rods. Thus, if a mass analyzer (18) is used with a quadrupole having ¼" diameter rods, with the same frequency power supply, it would allow mass selection of ions up to m/e 300,000.

After being mass analyzed in an apparatus such as that shown in FIG. 1, the cluster ions are then extracted from the analyzer 18 and focused by passing the beam 13 through the lens elements 19, 20, 21 and 22. Subsequently, the beam is passed into a post acceleration column 23. This column is of conventional form and consists of a plurality of metal plates 25A, 25B . . . 25N, that are suitably mounted in a vacuum system (shown generally as a ceramic walled housing 23A, having a suitable conventional interconnected means for evacuating it, shown diagrammatically by arrow 23B). The metal plates 25A-25N are separated by suitable ceramic insulators, 26A, 26B . . . 26N, which form part of the walls of the housing 23A. The plates (25A-25N) are also connected to external corona rings 27A, 27B, 27C-27N and to inner corona rings 27A', 27B'-27N'. The inner and outer corona rings are connected in series with a plurality of series resistors 28A, 28B . . . 28N, as shown, between respective pairs of the plates.

The post acceleration column 23 extends to a target chamber that is defined by an enlarged dome portion 23C and is formed of electrically conductive metal. The voltage applied on the dome 23C (from a source that is not illustrated) is controlled by a highly regulated power supply (not shown), which can be adjusted to achieve any voltage between −400 KV and +400 KV. All of the cluster ions exiting the quadrupole mass analyzer 18 are accelerated in this "Cockcroft-Walton like" post acceleration column 23, to the potential of a suitable workpiece 24, that has a selected target area 24A thereon. That potential is usually the same as the potential on the housing dome 23C when the apparatus is used to practice the method of the present invention. It will be noted that the preselected area 24A on workpiece 24 is positioned, as shown, to be impacted by the beam of cluster ions 13. As will be explained in detail below, a wide variety of different materials can be used to form the workpiece 24, and different configurations of the workpiece 24 can be used in practicing the many different applications of the method of the invention that will be apparent from the disclosure of it herein.

The type of apparatus shown in FIG. 1 is suitable for generating cluster ions of a desired predetermined size and for accelerating them to the critical velocities required to practice the method of the present invention. However, it should be apparent that other suitable conventional cluster ion source apparatus and associated accelerator apparatus can be used in practicing various arrangements of the method of the invention. Specifically, the type of cluster ion source apparatus shown in FIG. 1 is effective to produce mass analyzed beams of accelerated cluster ions that range in size from 25 to $2 \times 10^5$ AMU wherein the cluster ions can be, for example, either water or Hydrogen molecules or gas atoms, such as atoms of Argon. In those applications of the invention where cluster ions of various metals, such as electrically conductive cluster ions of copper, gold or other conductive metals are to be used, or where cluster ions of magnetic materials, such as iron, are to be used in practicing the method of the invention, it will be recognized that other suitable conventional types of cluster ion source apparatus and associated cluster ion beam accelerating apparatus should be used to appropriately practice the present invention.

Should a further description of a suitable method and apparatus for the production of cluster ions be desired, it should be recalled that such a method and apparatus are described in the above-noted, co-pending U.S. patent application, Ser. No. 452,362.

Figure 2:
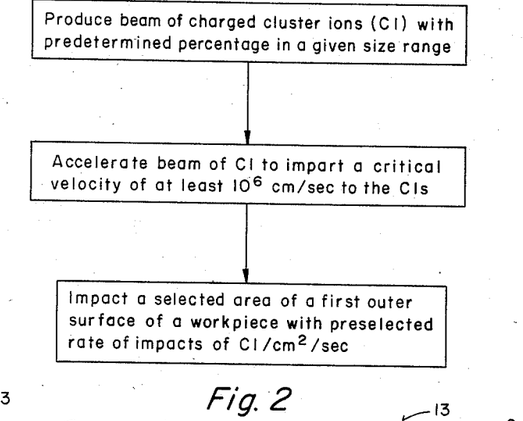
FIG. 2 is a flow chart showing preferred steps of one arrangement of the method of the invention.

A preferred arrangement of the method of the invention will now be disclosed with reference to FIG. 2. As shown by the flow chart of the preferred steps of the invention, which are illustrated by FIG. 2, our method for precisely modifying predetermined surface layers of a workpiece comprises, first, producing a beam of charged cluster ions in which a predetermined percentage of the cluster ions are mass selected to be in a given mean size range with a distribution of masses (about such a mean size) of the order of ±10%. A range in size from 25 to $10^6$ atoms can be generated for each cluster ion with the method of the invention. Desired narrow mass selection of such a beam of cluster ions is afforded, for example, by the mass spectrometer 18 in the apparatus shown in FIG. 1, which is operable to provide a desirably narrow mass distribution about a desired mean size of cluster ions i.e., a mass distribution within 1 or 2 atoms or molecules of a given relatively small cluster ion size. More generally, in one application of the method of the invention, all of the cluster ions in the desired predetermined percentage of cluster ions produced by a type of apparatus similar to that shown in FIG. 1 are in a mean size range of about 150 atoms per cluster ion, with a distribution of masses of the order of ±10%. In still other arrangements of the method of the invention the predetermined percentage of cluster ions are essentially all mass selected at about 50 atoms each, in size, with a distribution of masses of plus or minus 1 or 2 molecules per cluster ion.

In the next preferred step of the method, the beam of cluster ions is accelerated by passing it through a suitable accelerator, such as the draw out and focusing electrodes 14–16 shown in FIG. 1, and the lens elements and post accelerator column components 19–23 shown in FIG. 1, thereby to expose the beam to an electric field that is effective to impart a desired critical velocity of at least $10^6$ centimeters per second to each of the cluster ions. In practicing the most preferred method steps of the invention, the critical velocity to which the beam of cluster ions is accelerated is in the range of about $10^6$ to $8 \times 10^7$ centimeters per second. It has also been found desirable in practicing the method of the invention to operate the mass spectrometer 18 to assure that essentially all of the desired predetermined percentage of cluster ions produced in the output end of cluster ion beam 13 are, respectively, less than $10^6$ atoms in size.

Finally, in the preferred arrangement of the method of the invention, as it is shown in the flow chart of FIG. 2, a desired selected area of a first outer surface layer of a workpiece is impacted with the accelerated beam of cluster ions, at a preselected rate of impacts of cluster ions per square unit, per second. Such a workpiece 24 is shown in FIG. 1, with a preselected area 24A designated thereon, which is suitably positioned to be impacted by the illustrated beam of cluster ions 13. For most applications of the method of the invention, it has been found desirable to maintain the preselected rate of impacts of cluster ions on such a selected area of a workpiece in the range of about $10^6$ to $10^{12}$ cluster ions/cm$^2$/sec. Such a desired concentration of impacting energy on a selected area of an outer surface layer of a workpiece is useful in effecting a number of desirably controllable, precise modifications in the outer surface layer of the workpiece in the select area. As pointed out above, during the discussion of the background for the present description of the invention, and as will be explained in greater detail below, those skilled in the art will recognize that a wide variety of different precise modifications can be made in workpieces with the method of the invention, in order to produce a variety of different desired products or results.

Before describing some of those desirable applications for the method of the invention, and the resultant products and results that can be produced by its practice, it should be noted that the basic method of the invention has been found particularly suitable for effecting precise modifications in the outer surface layer of a workpiece when tests were conducted in which essentially all of the impacting cluster ions used were mass selected so that each cluster ion comprised about 50 to 150 molecules of $H_2O$, and wherein the electric field used to accelerate the cluster ions was made effective to energize each of the cluster ions in the range of 100 Kev to 400 Kev.

From the foregoing description of the basic steps and characteristics of the present invention, it can be seen that cluster ions that have been mass selected or grown to a particular predetermined range of sizes, and then accelerated to a critical velocity are thus made effective to provide a precisely controllable means for modifying either a predetermined outer surface layer, or just a few selected layers, of a workpiece. In sharp contrast with the known prior art bombardment of workpiece surfaces with atomic, or very small molecular particles, the method of the invention uses highly energized cluster ions that are effective to deposit energy with much higher efficiency in the outer layer, or in the first few layers immediately adjacent to the outer layer, of an impacted workpiece. Unlike the present method, when atomic particles or small molecular accelerated particles are given the same or closely similar kinetic energies per atom (to those energies used in the present method), they penetrate deeply into a workpiece rather than compressing the impacted outer surface layers of the workpiece. Such penetration causes the energy deposited by those smaller accelerated particles to be distributed over a longer penetration depth, rather than being essentially all diffused in the first few layers immediately adjacent to the outer surface layer of the workpiece.

Conversely, when very large cluster ions, such as the micrometeoroids discussed above in the background portion of this application, are used to machine or otherwise modify the surface layers of a workpiece, such applications are limited by the available energy per atom that can be developed to accelerate those very large cluster ions, due to the limited accelerating power available in present state of the art particle accelerators. Moreover, when such relatively large cluster ions, i.e., cluster ions having $10^{10}$ to $10^{15}$ atoms per cluster ion, are accelerated to velocities in excess of $10^5$ centimeters per second, they produce large, deep, unpredictably sized craters in the outer surface layers of a workpiece, because the energy deposited, per selected area of the impacted workpiece, produces significant extents of evaporation or sublimation of the workpiece following the initial cluster ion impact.

The foregoing sharp contrasts make it clear that the development of the present method for affording a precisely controllable modification of predetermined outer surface layers, of a workpiece, by the carefully controlled deposition of critically limited amounts of energy into those surface layers is unique and very advantageous. Such critically limited depositions of energy are effective to produce compressed areas that have a sufficiently large surface to volume ratio to diffuse excessive energy by conducting it radially outward from the points of impact, through selected outer surface layers, thereby to avoid undesirably excessive evaporation or sublimation of surface layer material in the vicinity of the cluster ion impacts. It will be appreciated that the method of the present invention thus bridges the gap between known prior art surface bombardment techniques that utilize particles that are either too small or energized at too low a velocity, to suitably compress selected outer layers of a surface area, and those methods that use much larger cluster ions, which are too large to be useful for controlled energy deposition in only very shallow surface layers of a workpiece. Also, as mentioned earlier, with such micro-meteoroid size cluster ions, the energy available per atom from current state of the art particle accelerators is severely limited, and the resultant craters that are produced with such large particles are too large, deep and irregular to be of practical value in many desired precise, microscopic surface modification treatments, such as those presently being contemplated for cleaning, polishing, or otherwise micromachining outer surface layers of workpieces by practicing the present invention.

Electron micrographs taken by the applicants, of selected areas of a workpiece that has been impacted and compressed by cluster ions containing between 50 to 150 molecules each, and energized to 300 Kev, in practicing the method of the present invention, demonstrate the potential for the effective use of such a medium range of sizes of cluster ions. When the impacting cluster ions are appropriately carefully controlled at a critical velocity, and used at a preselected rate of impacts/cm$^2$/sec. to produce shallow craters, or compression sites, in selected areas of impact on a workpiece, finely controlled modifications of the workpiece can be produced. It has been shown that such shallow craters of depressions can thus be made to have uniform dimensions and depths less than their respective diameters. Such uniform depression depths have been made, in practicing the method of the invention, to correspond generally to a few atomic layers of the outer surface layers of an impacted workpiece. Accordingly, with the methodology of control thus precisely established, it is clear that microtools having a resolution of tens of Angstrom units have now been made possible.

It is important in practicing the method of the invention to utilize cluster ions that are suitably charged in order to enable the ions to be appropriately accelerated to the characteristic critical velocity of the invention, i.e. to at least $10^6$ centimeters per second. Thus, each cluster ion used, in practicing the various alternative modes of the method of the invention, must have a charge, and for certain higher velocity applications of the method, multiple charges can be used on the cluster ions to increase their respective binding energies.

The very high local pressures and temperatures that are developed in the outer surface layers of a workpiece by the method of the invention have been found effective to precisely modify desired selected areas of such workpieces in many different ways. Because of the great concentrations of energy that are possible with the method of the invention, it is difficult to predict the complete range of such potential applications. For example, it is known that such very high temperatures and pressures have application in the development of intense new ion sources and in the development of systems for controlled nuclear reactions. It has also been found that the method of the invention is very useful in the production of holes that have significantly smaller diameters than the holes of approximately 10 micrometer diameter, which have been produced through film or sheet type workpieces with prior art methods, e.g., by chemically etching penetration tracks made in a workpiece by the passage of fast atomic particles. Of course, as noted above, the method of the invention does not require the utilization of such chemical etching to produce even smaller-diameter holes.

Another important application of the method of the invention is to effect a precise modification in predetermined surface layers of a workpiece by effecting an alteration of the grain size of the crystalline structure of a selected area of impact on an outer layer of a workpiece, adjacent to the points of impact of the critical velocity cluster ions. It has been found that by applying the method of the invention to impact a workpiece comprising a film of amorphous carbon and fine platinum grains, which film is about 65 Angstroms thick, a desirably controlled modification in the grain size is produced. For example, in one application of the method, designated areas of the film surrounding the areas of impact of the cluster ions showed evidence of modification of the platinum grains in the order of 100 to 500 percent, relative to the average grain size in the remainder of the platinum-carbon film of the workpiece. These results were observed in an application of the method of the invention in which the critical velocity of the cluster ions was in the range of $10^7$ to $2 \times 10^7$ centimeters per second as they impacted the workpiece. Accordingly, kinetic energy of the cluster ions was deposited into the outer surface layers of the platinum-carbon workpiece and diffused away from the area of initial cluster ion impact, thereby to effect the observed modifications of grain sizes in the halo-like areas immediately surrounding the impact areas.

Figure 3:
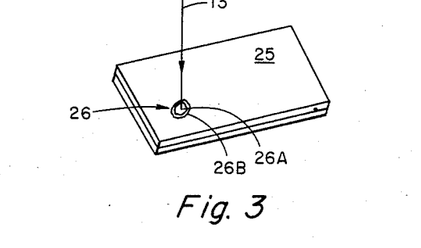
FIG. 3 is a schematic illustration, showing a top front perspective view of a multi-layer workpiece that has a depression shown at a greatly enlarged scale, on its top layer, which depression was formed by the impact of a cluster ion, according to the method of the invention.

FIG. 3 of the drawing schematically illustrates such a film workpiece 25 that comprises a 65 Angstrom thick film of amorphous carbon and fine platinum grains. A selected area 26 thereon, shown in greatly enlarged scale, illustrates a central area of compression 26A made by an impacting cluster ion, which was accelerated to a critical velocity according to the method of the invention. There is also illustrated a halo-like area 26B, formed around the impact area 26 in which area (26B) it was observed that modified grain sizes of the film grain structure were formed, as described in the paragraph immediately above. Although the mechanism for effecting such a modification of the granular film structure grain size, by practicing the method of the invention, is not completely understood, it is believed that the rapid diffusion of the very high temperatures developed by impacting cluster ions in the impact area 26A causes the resultant growth of the grain sizes.

Figure 4:
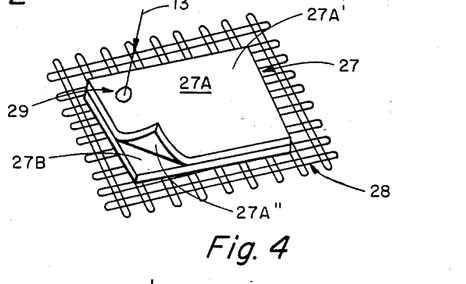
FIG. 4 is a perspective view of a dual-layer film, or sheet type, workpiece that is supported on a screen or grid to prepare it for being impacted by cluster ions, according to the application of one arrangement of the method of the invention.

Another type of desirable precise modification of an outer surface layer of a workpiece, as obtained by an application of the method of the invention, is schematically illustrated in FIG. 4 of the drawing. There is shown in FIG. 4, a workpiece 27 comprising a film 27A of amorphous carbon and fine platinum grains. The film 27A has a thickness in the range of about 50 to 200 Angstroms, and is supported by a backing film 27B of nitrocellulose, which is made about 100 Angstroms thick. The workpiece 27 is supported on a screen 28, which may be made of any suitable electrically conductive or dielectric mesh construction. The screen is effective to support the composite-film workpiece 27 without substantially increasing its rigidity in the selected areas thereof that are to be impacted with cluster ions, according to the method of the invention. By practicing the method of the invention to critically accelerate charged cluster ions having a narrow mass selected range of sizes, a selected area 29 of a first outer surface 27A' of the workpiece is impacted with cluster ions at a preselected rate of impacts of cluster ions/cm$^2$/sec. In addition to the compressive effect such impacts have on the first outer surface layer 27A' of the workpiece, it was observed that a further precise modification of the workpiece occurred. That further modification comprised the removal of portions of the second outer surface layer 27A" from the film 27A, on the side thereof directly opposite to the selected area of impact 29 by the beam of impacting cluster ions (13). It is apparent from this mode of application of the method of the invention that it is possible to achieve a precise modification in a predetermined surface layer or layers of a workpiece without having the accelerated cluster ions actually impact some of the surface layers to be modified i.e., in this illustrated case the second film 27B, as shown in FIG. 4, is not directly impacted by the cluster ions. Specifically, it was found that the cluster ions used to impact the first film 27A did not penetrate through that film's second surface layer 27A", but portions of the second surface layer 27A" were removed from the film 27A without being intermixed with particles of the cluster ion atoms. It should be apparent that such an application of the method of the invention will have utility, not only in precisely modifying the second outer surface layer 27A" of a workpiece, but in producing particles from that second outer layer which are not contaminated by direct exposure to the impacting cluster ions.

Further investigation of this particular mode of application of the method of the invention with the sort of multiple film workpiece 27 shown in FIG. 4 revealed that it is also possible to remove portions from a selected area of the outer surface layer of the second film 27B, disposed directly opposite to the selected area of cluster ion impact 29. In such an application of the invention, the selected area 29 of the outer surface of the first film, which is impacted by a cluster ion beam 13, was made to comprise a carbon-platinum film 27A, while the second film was again made of a totally different material; namely nitrocellulose. Thus, it can be seen that with such an application of the method of the invention not only is it possible to keep the material of the impacting cluster ions completely isolated from the portions or particles of the second outer surface layer 27A" of the carbon-platinum film 27A, but to also isolate them from the second film of nitrocellulose 27B, while removing particles or portions from the film 27B.

Figure 5:
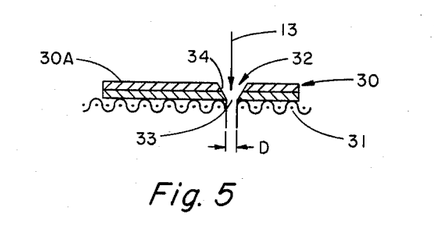
FIG. 5 is a schematic, side plan view, in cross section, showing a multiple film workpiece having a frusto-conical shaped hole through it, the hole having a generally cylindrical bore at its lower end. The hole was formed by an impacting cluster ion, in practicing one application of the method of the invention.

A further application of the method of the invention is illustrated in FIG. 5 of the drawing. In this application of the method, a workpiece sheet 30 comprising a film of carbon having a thickness in the range of 50 to 200 Angstroms is supported on a screen 31. According to this application of the invention, the film 30 is precisely modified by making generally circular holes or cavities of predetermined diameter through it with a beam (13) of impacting, charged cluster ions, that has a narrow mass selection of mean size within the range from 25 to $10^6$ atoms for each cluster ion, with a distribution of masses (about such a mean size) in the order of ±10%. The cluster ion beam is accelerated with a suitable electric field, thereby to impart a critical velocity of at least $10^6$ centimeters per second to the cluster ions. Then, a preselected area 32 of the surface 30A of the workpiece sheet 30 is impacted with the accelerated beam 13 of cluster ions, at a desired preselected rate of impacts of cluster ions/cm$^2$/sec. Such impacts serve to precisely modify the workpiece sheet by forming holes or cavities of a predetermined diameter at the respective points of impact of the cluster ions. It is a distinguishing characteristic of the method of the invention that each of the resultant holes or cavities 33 has a predetermined diameter that is greater than the diameter of the respective impacting cluster ion making it. Such a characteristic predetermined diameter (D) is designated schematically by the arrows shown at the bottom of the hole depicted in FIG. 5. It has been found that it is possible to control this predetermined diameter so that it is within a range of 20% to 50% greater than the diameter of the respective impacting cluster ions making the holes. Thus, it can be seen that a precisely controllable size of very small apertures can be formed in a sheet-type workpiece, thereby to produce a filter membrane, or other type of such suitably perforated material, that is much finer than has been available heretofore.

Figure 6:
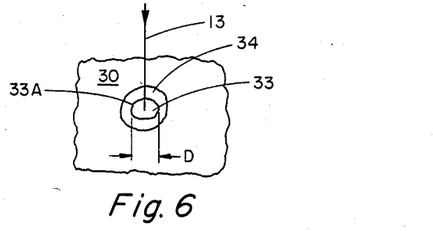
FIG. 6 is a top plan view of a fragment of the workpiece shown in FIG. 5, depicting the generally circular, tapered-sided, irregular edged hole that is formed therein by the impact of a cluster ion.

In order to further illustrate the desirable characteristic features of the configurations of holes that can be formed by such an application of the method of the invention, there is shown in FIG. 6 a top plan view of a portion of the workpiece sheet 30. In this view there is schematically illustrated, in greatly enlarged form, a generally circular hole 33 which is formed in the carbon film 30 by an impacting cluster ion. As shown, the hole has a general average diameter D. Another important feature of the hole is that the generally circular perimeter of this hole (33), and of each of the other holes (not shown) that are formed by other respective impacting cluster ions on the workpiece 30, is defined by a jagged irregular surface 33A.

As is also shown in FIGS. 5 and 6 of the drawing, a further characteristic surface feature of the impacted film 30 can be made with this type of application of the invention. It was found that the selected area 32 of the outer surface 30, which is impacted by the cluster ion beam 13, is precisely modified by having a generally frusto-conically shaped wall surface 34 (see FIGS. 5 and 6) formed through the carbon film 30. Again, the exact mechanism which causes such a characteristic configuration of such impact-formed hole surfaces is not fully understood, but it is believed that the intense heat generated by the impacting cluster ions is mostly diffused in the first few outer film layers 30A, due to the critically controlled velocity of the cluster ions. Thus, it is believed that more of the material in the outermost film layers is displaced, forming a large diameter of displacement, whereas in the deeper layers, there is less heat diffusion, thus, a smaller diameter of material displacement. In any event, it is apparent that a unique form of hole structure, which may be particularly useful in either making microscopic filtering membranes, or for making the type of tapered supersonic nozzle (10) that is shown in FIG. 1, can be developed using this mode of application of the method of the invention.

In one application of the method of invention to form the type of generally conically shaped hole surface (34), shown in FIGS. 5 and 6, the film 30 was made of carbon sheet material about 65 Angstroms thick, and essentially all of the cluster ions in the impacting beam 13 were mass selected so that the desired predetermined percentage of such cluster ions impacting the surface 30A were made to be about 50 atoms in size, (with a distribution of masses in the order of ±2 atoms) were made of water molecules, and were energized at about 200 Kev.

Figure 7:
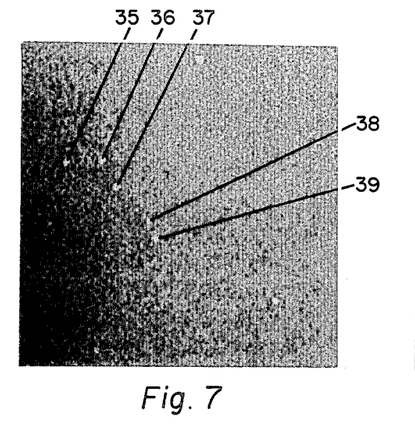
FIG. 7 is a bright field electron micrograph of a carbon film that has been impacted with cluster ions, according to the method of the invention. The accelerated cluster ions were effective to form very small holes or cavities through or in the film, as shown in this view of the film.
Figure 8:
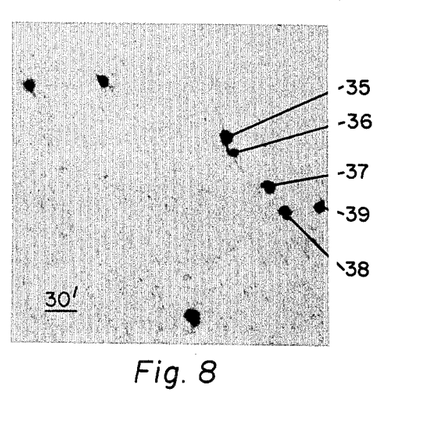
FIG. 8 is a dark field electron micrograph of the carbon film shown in FIG. 7 (inverted relative to FIG. 7), illustrating the same cluster ion-formed holes or cavities made by practicing the method of the invention.

A number of experiments with different applications of the method of the invention were designed to examine the relative importance of cluster ion energy and cluster ion size on the effects of cluster ion impact on the workpiece surfaces studied. In those experiments, ion intensities were generally maintained at levels that would not permit multiple impacts within short distances of each other, but as will be seen, in some experiments the intensities were deliberately increased to demonstrate the effects that can be achieved with the method of the invention when multiple impacts of cluster ions occur in substantially the same area of a workpiece. The type of evidence generally described above, relative to the production of very small holes in carbon films, that were used in the experiments and were approximately 65 Angstroms thick, was further demonstrated by both bright field and dark field electron micrographs that were taken of the bombarded carbon film workpieces. As shown by the electron micrographs depicted in FIGS. 7 and 8, cluster ions of 100 water molecules that were accelerated to energies of approximately 300 kV, were effective to form the very small, generally circular holes shown in those Figures. The bright field illustration of FIG. 7 shows a plurality of spaced holes 35, 36, 37, 38 and 39 (as well as other un-numbered holes), which were formed by cluster ions impacting the carbon film 30'. Likewise, the dark field illustration of FIG. 8, which shows the same carbon sheet 30', also clearly shows the holes 35–39. The holes in FIG. 8 are numbered in reverse order, relative to their numbering in FIG. 7.

Similar results were obtained with cluster ions of 100 argon atoms, which were accelerated to the same terminal energy, then impacted on a carbon film of about 65 Angstroms in thickness. Studies with cluster ions having mean sizes of 50 and 500 argon atoms, respectively (with mass distributions of ±10%), which were accelerated to energies of 200 kV, showed small holes, which were presumably produced by the smaller cluster ions that contained much more energy per constituent atom. However, no visible evidence of surface alteration could be discerned from impacts of the larger (500 argon atom) cluster ions, which contained energies of only about 400 eV per constituent atom. Thus, it appears that a critical energy density is required for the production of small holes by the cluster ion impact method of the present invention.

Estimates of the energy loss, as determined from stopping power theory, are very crude with extremely low velocity ions. But the larger cluster ions (500 argon atoms each) would appear to clearly have the potential of depositing sufficient energy in the films that were bombarded according to the tests of the method of the invention, to thereby produce holes through such films.

Irradiation of carbon film samples with beams of sufficient intensity to produce closely spaced multiple impacts of the cluster ions show evidence of radiation damage that is stored in the carbon films, and that becomes visible by secondary impacts which serve to further "etch" the areas that were energized by an earlier impact. Tracings of both bright field and dark field micrographs of carbon films that were subjected to such more intense bombardment, by impacting them with 100 molecule water cluster ions which were energized to 200 kV, are shown in FIGS. 9 and 10.

Figures 9, 10:
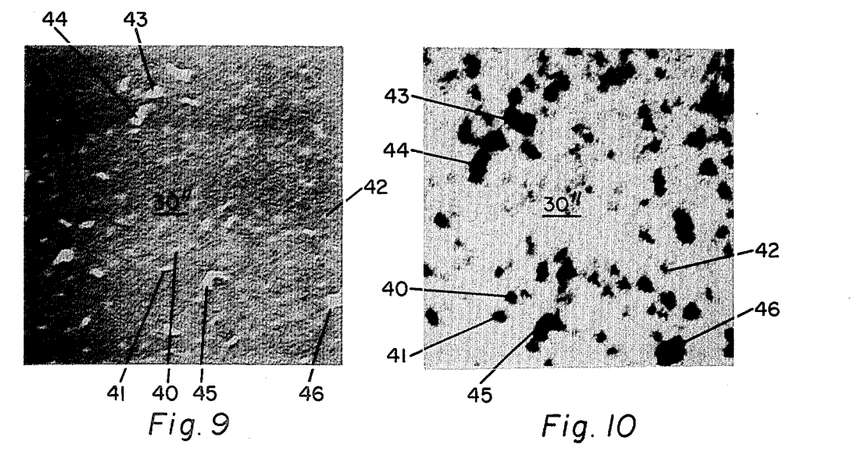
FIGS. 9 and 10 are, respectively, tracings of bright field and a dark field electron micrographs of a carbon film that has been bombarded with a more intense beam of cluster ions, than the beam used to make the holes or cavities shown in FIGS. 7 and 8; accordingly, the larger holes shown in FIGS. 9 and 10 illustrate the types of hole or cavity configurations that can be formed with this mode of practicing the method of the invention.

The bright field illustration of FIG. 9 and the dark field illustration of FIG. 10 both show the same area of a carbon film 30" that has a plurality of small, generally circular holes 40, 41, 42 (and other un-numbered holes), as well as a plurality of larger holes 43, 44, 45, 46 (and other un-numbered larger holes). It appears that the larger holes depicted in FIGS. 9 and 10 resulted from multiple impacts of cluster ions in nearly the same, or closely spaced, areas on the film 30". Thus, the preselected rate of cluster ion impacts/cm$^2$/sec., which was chosen for use in this test application of the method of the invention to make holes of a nearly uniform, very small diameter, can be seen to be a controllable variable for producing either the generally uniform diameter holes shown in FIGS. 7 and 8, or for producing the larger, more randomly sized holes shown in FIG. 9 and 10 (along with the associated small holes depicted in FIGS. 9 and 10).

Figure 11:
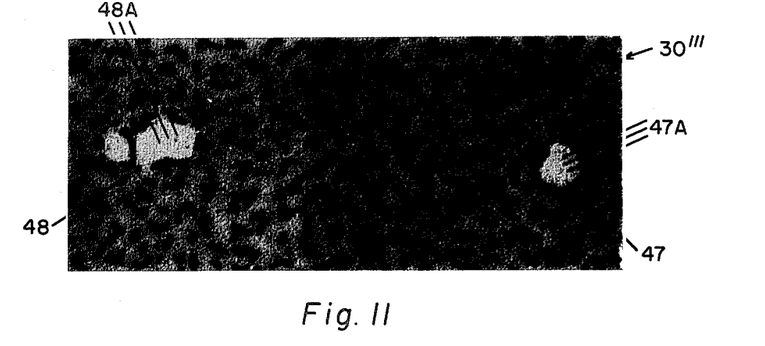
FIG. 11 is a tracing of a bright field electron micrograph of a carbon film that has been bombarded with a beam of cluster ions, according to one mode of practicing the method of the invention, then the film was treated with gold vapor to enhance the definition of the holes or cavities formed in it by the impacting cluster ions.

Further studies on carbon films that were subjected to impacts by 150 water molecule cluster ions, energized to 300 kV, in which the films were subsequently treated with gold to improve contrast, show that holes that have been formed by the impacting cluster ions contain traces of the original carbon film lattice. Thus, the holes that have been formed by the cluster ion impacts do not appear to necessarily, simply fragment exclusively around the peripheral edges of the impact sites, at least not in all cases. If fragmentation occurs, as is, in fact, suggested by the irregular edges observable in the holes 47 and 48, which are shown in the tracing of an electron micrograph of such a sputtered-gold enhanced carbon film 30''', in FIG. 11, then the residue 47A and 48A, which is observable in these holes indicates the ejection from the film 30''' of fragments that are significantly smaller than the magnitude of the volume of the respective holes. On the other hand, if the holes were drilled by energy deposition, followed by evaporation, exclusively, it would be difficult to account for residue in what was originally probably a very hot zone.

The mechanism of energy deposition by an impacting cluster ion, and the details of the removal of matter from an impacted film, thereby to leave the resultant holes or cavities, is a very complex process. However, it is clear that these impact processes have the capability of altering the structure of film surfaces in a manner that can be controlled at least to a limited extent by regulating the cluster ion sizes and the cluster ion energy, according to the method of the invention. Thus, it has been proven that extremely small holes having precisely determinable diameters can be created in thin films by practicing the method of the invention.

Figure 12:
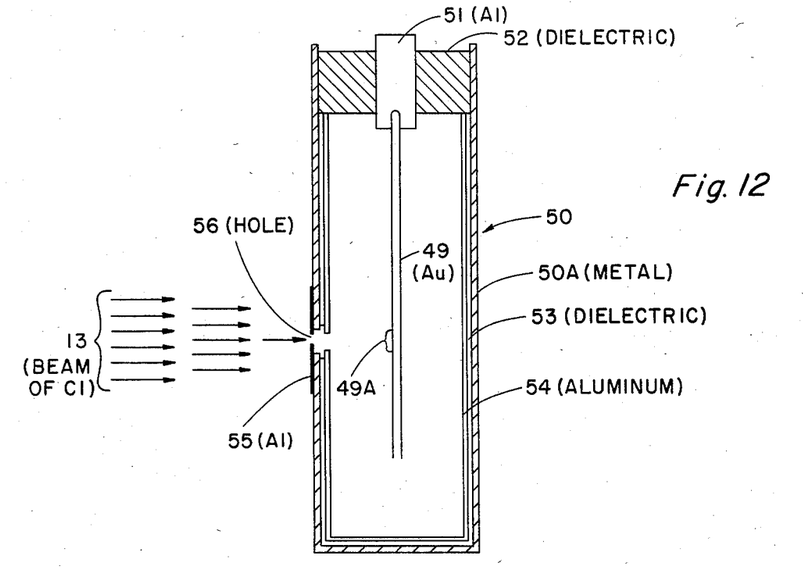
FIG. 12 is a side view, in cross section, showing a sputtering chamber in which a gold foil is supported in a suitable position to have a preselected target area on it bombarded by cluster ions, according to one arrangement of the method of the invention.

The method of the invention has also been applied to precisely modify a workpiece by sputtering an outer surface layer of it in a selected area in order to remove a portion of that selected area from the workpiece. FIG. 12 schematically illustrates such an application of the method of the invention.

There is shown in FIG. 12, a relatively thick workpiece of gold foil 49 having a selected cluster ion impact area 49A thereon. The foil is suitably mounted within a surrounding container 50. The container includes, in its top wall, an aluminum combination foil-support and electrical contact 51 that is held in a Teflon plug 52. Container 50 further comprises an outer aluminum cylinder 50A, a Teflon liner 53, an inner aluminum foil 54, and an outer aluminum foil mask 55. The container 50 is effective to cause metal that is sputtered from the gold foil workpiece 49 to be deposited on the aluminum foil 54. An accelerated beam of cluster ions 13, according to the method of the invention, is directed against the selected area of impact 49A, which in this case is defined by a suitably shaped collimating hole 56 that is made to have a diameter of about 3/32 inch through the aluminum foil mask 55. The mask was 0.001 inch thick. Larger holes are formed, respectively, as shown, in the multiple layers of the container 50, to allow the beam 13 to reach the impact area 49A. It will be noted that the hole through dielectric Teflon liner 53 is set back (from beam 13), relative to the smaller diameters of the holes through cylinder 50A and inner foil 54. Although the aluminum foil 54 does not cover the Teflon plug 52, it has been found that almost all metal that is sputtered from the workpiece 49 is collected on the foil 54.

In practicing the method of the invention in this application, the net current into the workpiece 49 is measured to confirm the rate of cluster ion impacts/cm$^2$/sec. The Teflon liner 53 and the Teflon plug 52 provide electrical insulation so that the net currents into the separate parts of the apparatus may be measured. The Teflon plug 52, and the aluminum combination foil-support and electrical contact 51, support the workpiece 49 within the container 50 while preventing it from touching the aluminum foil 54, so that no gold is transferred by direct contact.

Figure 13:
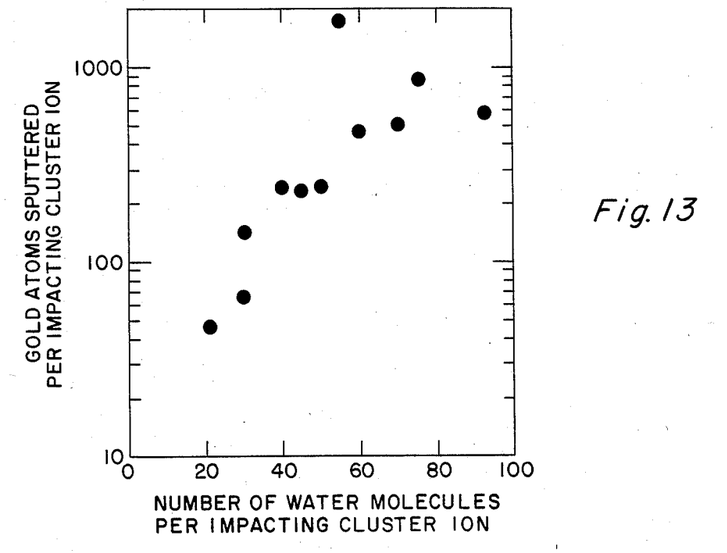
FIG. 13 is a graph on which test data is plotted to show a trend of sputtering ratios that resulted from sputtering tests conducted with the method of the invention, using a sputtering chamber such as that shown in FIG. 12.

In one series of sputtering tests to demonstrate such an application of the method of the invention, water cluster ions were directed against the gold foil workpiece impact area 49A. For each test in the series, a specific cluster ion size was used and a fresh aluminum foil 54 was employed to collect sputtered gold; thus, each aluminum foil 54 was used for only a single test. The selected cluster ion mean sizes varied in the respective tests from 21 to 93 water molecules, and each ion included a proton to provide the necessary charge for accelerating the cluster ion. The mass distribution of the cluster ions about their respective mass selected mean size was within ±10% of the mean size. The cluster ion energies were chosen so that each water molecule in the respective cluster ions had 3 Kev of energy. Thus, total cluster ion energies ranged from 63 Kev to 289 Kev, in the respective tests. The majority of the sputtering yields, or numbers of gold atoms sputtered per impacting cluster ion, showed an exponential dependence on cluster size, with some scatter being observed among the graphed points, as shown in FIG. 13. The test result points plotted on the graph in FIG. 13 show that these yields ranged from 47 gold atoms sputtered from the workpiece 49, by the impacts of 21 water molecule cluster ions, to 600 gold atoms sputtered by the impacting 93 water molecule cluster ions.

It is impossible to achieve such efficient sputtering by accelerating single molecules of water, each energized to any value within the same range, i.e., of 63 to 289 Kev, because a major portion of their kinetic energy is deposited at too great a depth in the workpiece, due to their necessarily deep penetration through many layers of the workpiece. Consequently, such single molecules give sputtering yields that are generally less than one tenth of the yield achieved by using cluster ions having a critical velocity, according to the method of the invention. On the other hand, as pointed out earlier, it is known that when sputtering is performed with very heavy atoms, such as accelerated silver or mercury atoms, sputtering yields as high as 20 to 50 are achieved when the impacting atoms are energized at about 45 Kev. Thus, it has been observed that with the method of the invention it is possible to cluster a given atom or molecule, such as the water molecules which were accelerated to a critical velocity according to the method of the invention, and then obtain sputtering yields with the accelerated cluster ions that are about tenfold as great as could be obtained by accelerating a single similar molecule having an equivalent energized level.

Furthermore, because of the relatively low energy per constituent atom in the cluster ions, the enhanced sputtering obtained with cluster ions is limited to the shallower depths of penetration of these cluster ions. The sputtering achieved with 289 Kev cluster ions of 93 water molecules removes surface atoms limited by the energy deposition of 3 Kev/water molecule with cluster ions. Comparison with sputtering by much more energetic water molecules would reveal deposition of energy far deeper into the gold workpiece surface sputtered, with less control over the exclusive removal of atoms near the surface of impact area 49A.

In such sputtering application of the method of the invention, it is desirable to mass select among the cluster ions produced by the source so that the clusters in the accelerated beam have sizes in a narrow range about an average or modal size such as 30 water molecules per cluster ion. To provide fine control of the sputtering process, the selected sizes should be mass selected within 1 to 5 molecules of such an average or modal size. Each of the cluster ions should then be energized to the desired predetermined level. Such mass selection was in fact practiced during the series of tests of the metal sputtering application of the method of the invention, as discussed above. Accordingly, to achieve a rapid sputtering of the preselected area 49A of the workpiece 49, the preselected rate of cluster ion impacts was maintained in the range of about $10^8$ to $10^{10}$ cluster ions/cm$^2$/sec.

As noted earlier, the method of the invention is also useful in accelerating cluster ions to a predetermined critical velocity that is effective to enable the cluster ions impacting a workpiece to be bonded to an impacted outer surface layer of the workpiece. The particular bonding mechanism between the impacting cluster ion material and the material of the outer surface layer of a given workpiece is not fully known, but it is believed that the cluster ions are bonded to the workpiece by being at least partially fused with it, due to the very intense heat generated by the great concentration of kinetic energy that is achieved in the critically accelerated cluster ions used in practicing the method of the invention. Accordingly, in given applications of the method of the invention, cluster ions impacting a given workpiece, such as a dielectric substrate sheet material, can be formed of electrically conductive atoms such as atoms of gold or silver. Alternatively, the impacting cluster ions can be formed of electrically semi-conductive material that can be very firmly bonded to, or implanted in carefully controllable outer surface layers of a workpiece. Thus the method can be used to bond or implant conductors or semi-conductors on a conventional substrate material, such as those used in making microelectronic circuit chips. In yet another alternative application of the method of the invention, the impacting cluster ions can be formed of atoms of magnetic material, so that very densely packed micro-magnets can be precisely bonded to a suitable workpiece substrate material. In such applications of the method of the invention where electrically conductive cluster ions are bonded to a dielectric workpiece, it is possible to precisely form the impacting cluster ions in a bonded line configuration such that densely packed electrical conductors can be readily formed on a workpiece.

From the foregoing description of the method of the invention it will be apparent to those skilled in the art that many further modifications and alternative arrangements of the method of the invention and of the types of products producible with it can be made. Accordingly, it is our intention to encompass the true spirit and scope of the invention in the following claims.

We claim:

1. A method of precisely modifying predetermined surface layers of a workpiece, comprising the steps of;
    a. producing a beam of charged cluster ions wherein a predetermined percentage of the cluster ions have a mean size within the range from 25 to $10^6$ atoms per cluster ion,
    b. accelerating said beam of cluster ions with an electric field having an accelerating field gradient, thereby to impart a critical velocity of at least $10^6$ centimeters per second to each of the cluster ions, and
    c. impacting a selected area of a first outer surface layer of a workpiece with said accelerated beam of cluster ions at a preselected rate of impacts of cluster ions/cm$^2$/sec., thereby to effect a precise modification in the outer surface layers of the workpiece in said selected area, said precise modification comprising a predetermined alteration of the configuration of said outer surface layers of the workpiece in said selected area thereof.

2. A method as defined in claim 1 wherein essentially all of said predetermined percentage of cluster ions is less than $10^6$ atoms in size, and wherein the distribution of masses of the cluster ions is of the order of $\pm 10\%$ about said mean size.

3. A method as defined in claim 2 wherein essentially all the cluster ions in said predetermined percentage of cluster ions are in the range of 50 to 150 atoms per cluster ion, and wherein said critical velocity is in the range of about $10^7$ to $2 \times 10^7$ cm/sec.

4. A method as defined in claim 3 wherein essentially all of said cluster ions each comprise about 50 to 150 molecules of H$_2$O, and wherein said electric field gradient is effective to energize each of the cluster ions in a range of about 175 Kev to 400 Kev.

5. A method as defined in claim 2 wherein said preselected rate of impacts is in the range of about $10^6$ to about $10^{12}$ cluster ions/cm$^2$/sec.

6. A method of precisely modifying predetermined surface layers of a workpiece, comprising the steps of;
   a. producing a beam of charged cluster ions wherein a predetermined percentage of the cluster ions have a mean size within the range from 25 to $10^6$ atoms per cluster ion, with essentially all of said predetermined percentage of cluster ions being less than $10^6$ atoms in size, and wherein the distribution of masses of the cluster ions is of the order of ±10% about said mean size,
   b. accelerating said beam of cluster ions with an electric field having an accelerating field gradient, thereby to impart a critical velocity of at least $10^6$ centimeters per second to each of the cluster ions, and
   c. impacting a selected area of a first outer surface layer of a workpiece with said accelerated beam of cluster ions at a preselected rate of impacts of in the range of about $10^6$ to about $10^{12}$ cluster ions/cm²/sec., thereby to effect a precise modification in the outer surface layers of the workpiece in said selected area, said precise modification comprising an alteration of the grain size of the structure of said outer layer adjacent to the points of impact of said cluster ions with said workpiece.

7. A method as defined in claim 6 wherein said critical velocity is effective to enable the cluster ions impacting said workpiece to diffuse their energy into said outer surface layers of the workpiece and away from the areas of initial impact therewith, and wherein said modification in grain size in said designated areas comprises a change in the range of 100 to 500 percent in the average modified grain sizes relative to the average grain sizes in the unimpacted remainder of the workpiece.

8. A method as defined in claim 5 wherein said workpiece is a film having a thickness in the range of about 50 to 200 Angstroms, said method including the step of supporting said film without substantially increasing its rigidity in said selected area thereof impacted by the beam of cluster ions, and wherein said precise modification comprises the removal of portions of a second outer surface from said film on the side thereof opposite to the selected area impacted by said beam of cluster ions.

9. A method as defined in claim 8 wherein said cluster ions do not penetrate through said second outer surface, whereby said portions of said second outer surface are removed from the film without being intermixed with or contaminated by particles of said cluster ions.

10. A method as defined in claim 8 wherein the selected area of the outer surface layer impacted by said cluster ion beam is formed of a first film material and wherein said second outer surface is formed of a second film material.

11. A method as defined in claim 10 wherein said first film material is amorphous carbon-platinum, and said second film material is nitrocellulose.

12. A method as defined in claim 10 including adhering a film of nitrocellulose to said second outer surface of the first film, and supporting spaced points of said nitrocellulose film with a relatively rigid support member, thereby to prevent the nitrocellulose film from being moved significantly at said spaced points responsive to the first film being impacted by said beam of cluster ions.

13. A method as defined in claim 12 wherein said first film of carbon-platinum is about 65 Angstroms thick, and said nitrocellulose film is about 100 Angstroms thick.

14. A method of precisely modifying a workpiece sheet, that is in the range of about 50 to 200 Angstroms thick, by making generally circular holes of a predetermined diameter through said sheet, comprising the steps of;
   a. producing a beam of charged cluster ions wherein a predetermined percentage of the cluster ions have a mean size within the range from 25 to $10^6$ atoms per cluster ion,
   b. accelerating said beam of cluster ions with an electric field, thereby to impart a critical velocity of at least $10^6$ centimeters per second, and of less than $8 \times 10^7$ centimeters per second, to each of the cluster ions, and
   c. impacting a selected area of the workpiece sheet with said accelerated beam of cluster ions at a preselected rate of impacts of cluster ions/cm²/sec., thereby to precisely modify the workpiece sheet by forming holes of a predetermined diameter through it at the respective points of impact of said cluster ions, each of said holes having a predetermined diameter that is greater than the diameter of the impacting ion that made the respective holes.

15. A method as defined in claim 14 wherein said predetermined diameter of each of said holes is in the range of 20% to 50% greater than the diameter of the respective impacting cluster ions making the holes, and wherein the distribution of masses of the cluster ions is of the order of ±10% about said mean size.

16. A method as defined in claim 14 wherein the generally circular perimeter of each of said holes is defined by a jagged irregular surface.

17. A method as defined in claim 14 wherein said preselected rate of impacts is effective to form a significant percentage of said holes with irregular cross-sections and with a maximum diameter 2 to 3 times greater than the diameter of said impacting cluster ions.

18. A method as defined in claim 14 wherein said generally circular holes have generally frusto-conically shaped wall surfaces.

19. A method as defined in claim 18 wherein said workpiece comprises a first film material of amorphous carbon-platinum, and a second film of nitrocellulose, said carbon-platinum film being about 65 Angstroms thick, and essentially all of the cluster ions in said predetermined percentage of cluster ions are made of about 50 molecules of $H_2O$, with a distribution of masses of ±5 molecules per cluster ion, and each of the cluster ions being energized at about 200 Kev.

20. A method as defined in claim 5 wherein said precise modification comprises sputtering said outer surface layer of the workpiece in said selected area thereof to remove a carefully controlled portion of that selected area from the workpiece.

21. A method as defined in claim 5 wherein essentially all of the cluster ions in said predetermined percentage of cluster ions are of a mean size in the range of 30 to 150 atoms per cluster ion, with a mass distribution of the cluster ions about said mean size of the order of ±10%, and each of said cluster ions within said range is energized in a range of about 90 to 400 Kev.

22. A method as defined in claim 21 wherein essentially all of said cluster ions within said range are made of about 30 ±3 molecules of $H_2O$, and are energized at about 300 Kev.

23. A method as defined in claim 22 wherein said outer layer of the workpiece is formed of gold.

24. A method as defined in claim 23 wherein essentially all of said cluster ions within said range are made of 30 molecules of water and are energized at about 90 Kev, whereby gold atoms are sputtered from said workpiece in a ratio in the range of about 67 to 140 gold atoms per impacting water cluster ion.

25. A method as defined in claim 1 wherein said beam of charged cluster ions is produced with a preselected percentage of said cluster ions multiply charged, and wherein said predetermined percentage of cluster ions is mass selected to a narrow range of mean size having a distribution of masses of ±10% about said mean size.

26. A method as defined in claim 25 wherein said preselected rate of impacts is in the range of about $10^6$ to $10^8$ cluster ions/cm$^2$/sec.

27. A method of precisely modifying a workpiece by impacting it with cluster ions to firmly bond material to it, comprising the steps of;
   a. providing a beam of charged cluster ions wherein a predetermined percentage of the cluster ions have a mean size within the range from 25 to $10^6$ atoms per cluster ion,
   b. accelerating said beam of cluster ions to impart a critical velocity in the range of $10^6$ to $8 \times 10^7$ cm/sec. to each of the cluster ions, and
   c. impacting a selected area of the workpiece with said accelerated cluster ions, at a preselected rate of impacts/cm$^2$/sec., thereby to firmly bond the cluster ions to predetermined outer layers of the workpiece.

28. A method as defined in claim 27 wherein the cluster ions are bonded to the workpiece by being at least partially fused with it.

29. A method as defined in claim 26 wherein said cluster ions impacting the workpiece are formed of atoms or molecules of electrically conductive material.

30. A method as defined in claim 26 wherein said cluster ions impacting the workpiece are formed of electrically semi-conductive material.

31. A method as defined in claim 26 wherein said cluster ions impacting the workpiece are formed of magnetic material.

32. A method as defined in claim 29 wherein said selected area comprises a line, whereby the cluster ions bonded to said line form an electrical conductor along the line.

33. A method as defined in claim 27 wherein said impacting ions are implanted within the two or three outermost layers of said workpiece.

* * * * *